(12) United States Patent
Khorram

(10) Patent No.: US 7,551,901 B2
(45) Date of Patent: *Jun. 23, 2009

(54) LINEAR HIGH POWERED INTEGRATED CIRCUIT AMPLIFIER

(75) Inventor: Shahla Khorram, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 469 days.

This patent is subject to a terminal disclaimer.

(21) Appl. No.: 11/281,059

(22) Filed: Nov. 16, 2005

(65) Prior Publication Data

US 2006/0068723 A1   Mar. 30, 2006

Related U.S. Application Data

(63) Continuation of application No. 10/200,959, filed on Jul. 23, 2002, now Pat. No. 6,996,379.

(51) Int. Cl.
*H04B 1/02* (2006.01)
(52) U.S. Cl. .................. 455/91; 455/211; 455/333
(58) Field of Classification Search ............... 455/95, 455/73, 84–86, 209, 211, 255, 258–259, 455/293, 311, 312, 324, 326, 333, 341
See application file for complete search history.

(56) References Cited

U.S. PATENT DOCUMENTS 6,816,012 B2   11/2004   Aoki et al.

*Primary Examiner*—Tony T Nguyen
(74) *Attorney, Agent, or Firm*—Garlick Harrison & Markison; Timothy W. Markison; Kevin L. Smith

(57) ABSTRACT

A linear high powered integrated circuit amplifier includes a plurality of power amplifiers, balanced integrated circuit coupling, and a combining circuit. The balanced integrated circuit coupling couples a signal to the plurality of power amplifiers to the up-conversion module such that the power amplifiers amplify the signal to produce a plurality of amplified radio frequency (RF) signals. The combining circuit is operably coupled to combine the plurality of amplified RF signals to produce a high-powered amplified signal.

14 Claims, 5 Drawing Sheets linear high-powered IC transmitter 100 linear high-powered IC transmitter 100 linear high-powered IC transmitter 130 linear high-powered IC transmitter 140

LINEAR HIGH POWERED INTEGRATED CIRCUIT AMPLIFIER

This patent application is claiming priority under 35 USC § 120 as a continuing patent application of to the following patent application, which is hereby incorporated herein by reference in its entirety and made part of the present U.S. Utility Patent Application for all purposes:

1. U.S. Utility application Ser. No. 10/200,959, entitled "LINEAR HIGH POWERED INTEGRATED CIRCUIT TRANSMITTER", filed Jul. 23, 2002, now issued as U.S. Pat. No. 6,996,379, on Feb. 7, 2006.

BACKGROUND OF THE INVENTION

1. Technical Field of the Invention

This invention relates generally to communication systems and more particularly to radio transmitters used within such systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As an example, an integrated circuit transmitter implemented utilizing 0.18 μ CMOS technology, the maximum output power of a power amplifier is approximately 7 dBm (dBm=10log(power in miliwatts). While this limited output power range is acceptable for some applications, it is not acceptable for many of the newer radio applications (such as IEEE 802.11a, b, Bluetooth, et cetera) that require as much as 20 dBm of output power from the transmitter.

One solution to provide a greater output power is to use higher performance integrated circuit process such as gallium arsenide or silicon germanium. While these processes improve the output power, they are significantly more expensive and thus limit their applicability to produce in high-end communication equipment. Another solution, which is more popular, is to use an off-chip power amplifier. This solution provides greater power, but requires additional integrated circuits and/or discrete components to implement the power amplifier.

Therefore, a need exists for a CMOS based on-chip power amplifier solution that provides a linear output response and that provides output power greater than 7 dBm.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
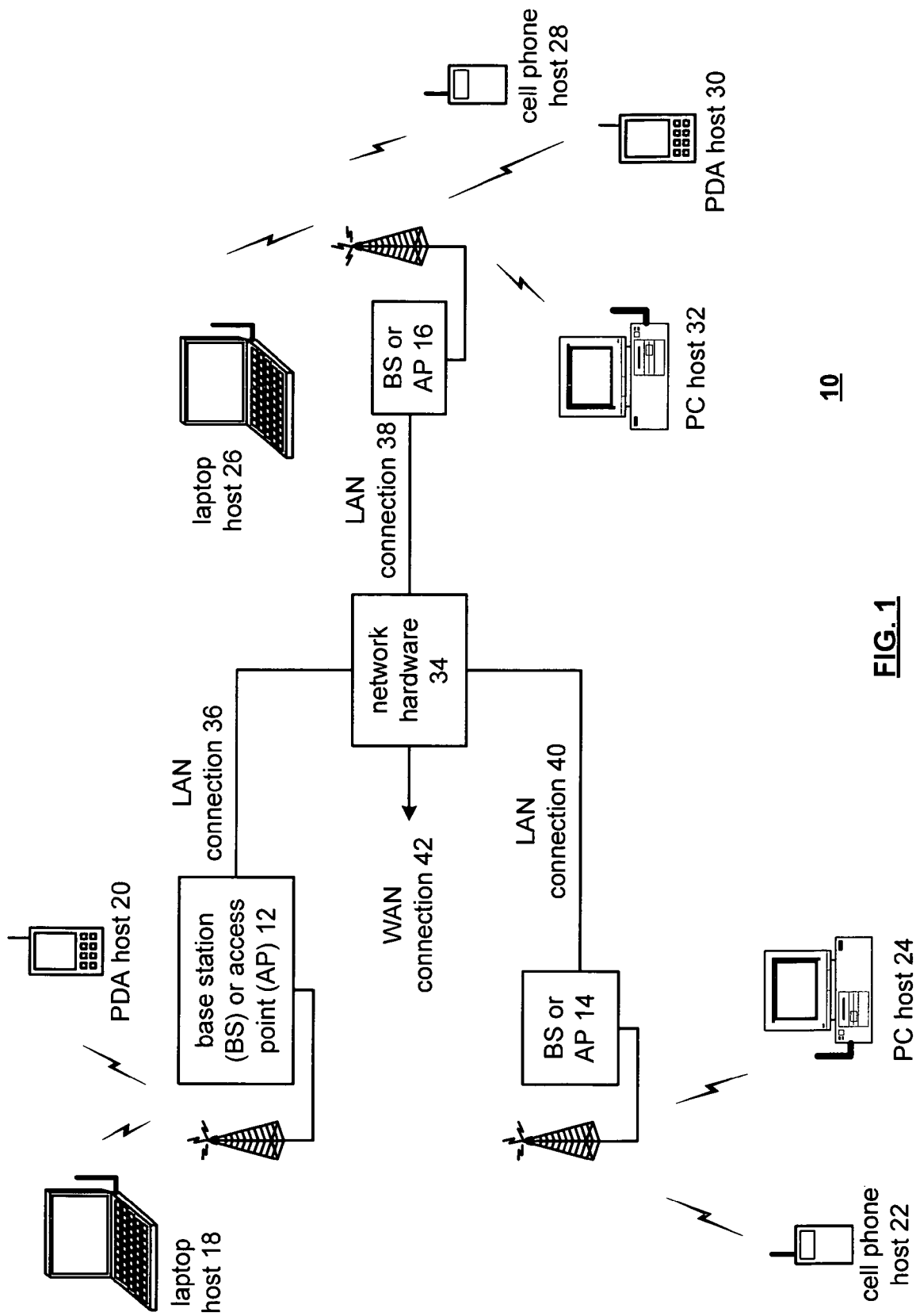
FIG. 1 is a schematic block diagram of a wireless communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
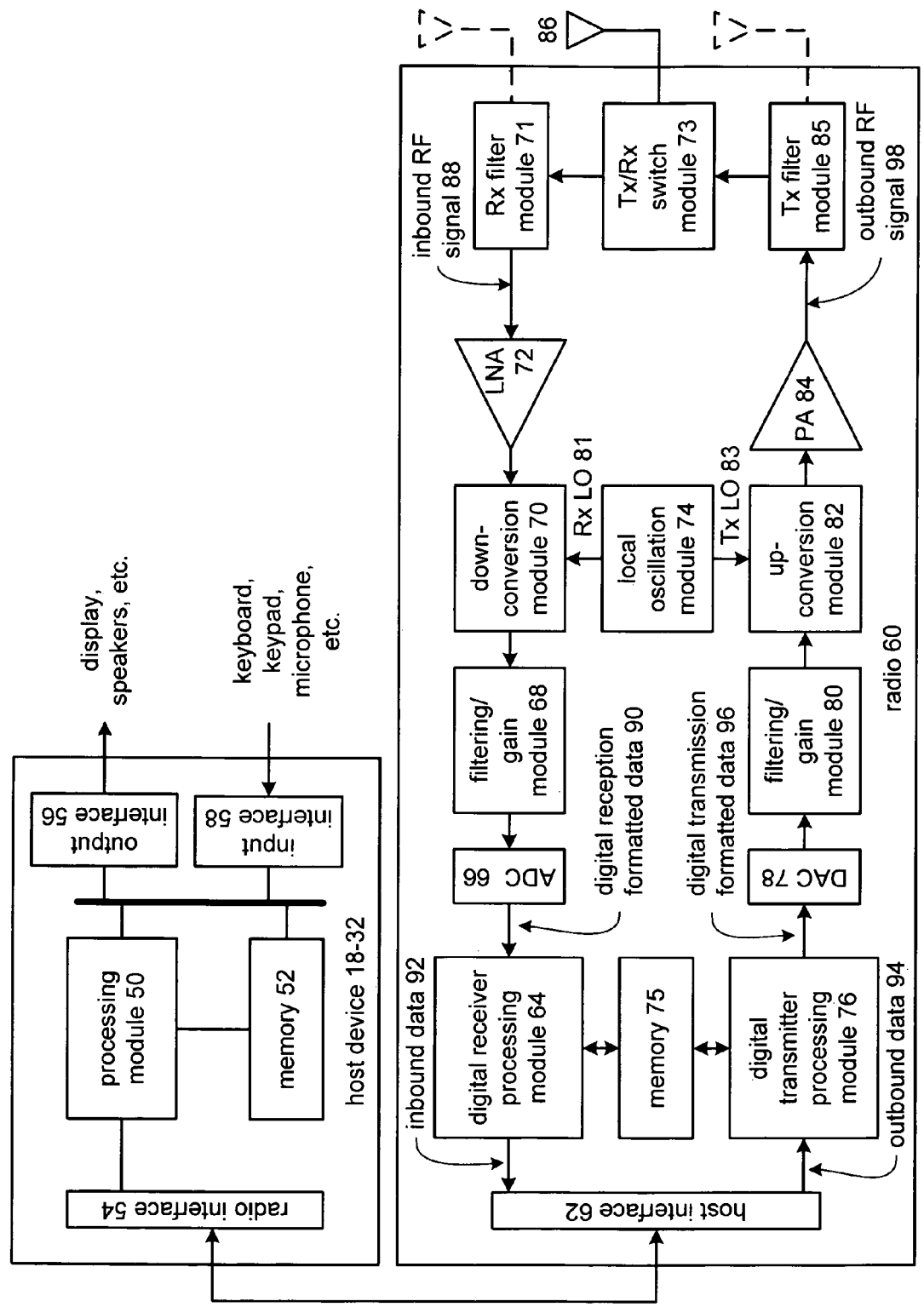
FIG. 2 is a schematic block diagram of a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74. The power amplifier 84, which may be implemented in accordance with the present invention, amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
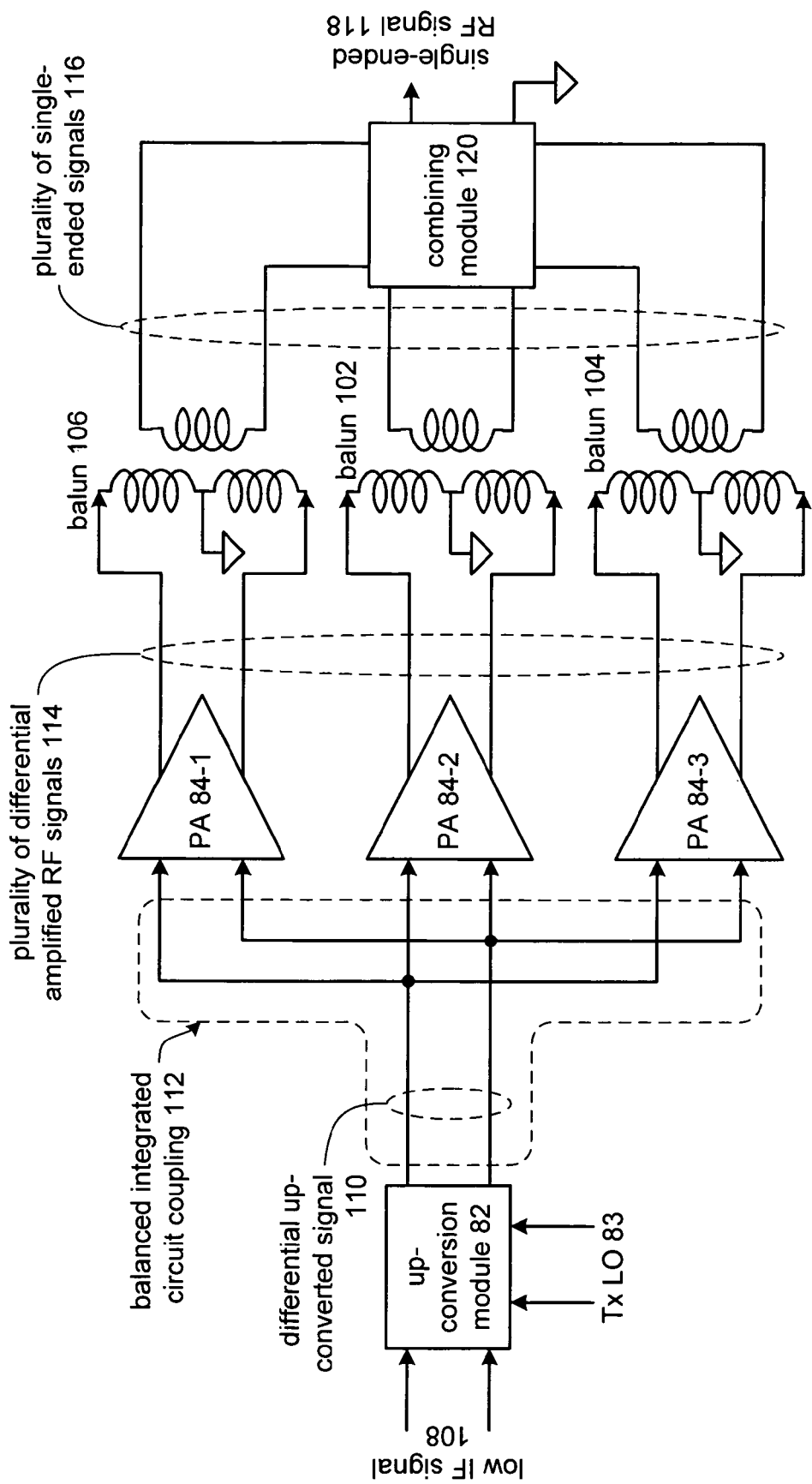
FIG. 3 is a schematic block diagram of a linear high powered integrated circuit transmitter in accordance with the present invention.

FIG. 3 is a schematic block diagram of an embodiment of a linear high powered integrated circuit transmitter 100 that may be used in the wireless communication device illustrated in FIG. 2. The transmitter 100 includes an up-conversion module 82, a plurality of power amplifiers 84-1 through 84-3, a plurality of baluns 102-106 and a combining module 120. The transmitter 100 may be implemented as an integrated circuit and may be fabricated in accordance with CMOS technology, or any other type of integrated circuit technology.

The up-conversion module 82 is operably coupled to mix a differential low IF signal 108 with a differential transmit local oscillation signal 83. The output conversion module 82 provides the differential up-converted signal 110 to the plurality of power amplifiers 84-1 through 84-3 via the balanced integrated circuit coupling 112. The balanced integrated circuit coupling 112 constitute metal traces formed on one or more layers of the integrated circuit and exhibit similar frequency response characteristics and impedances such that the coupling between each of the plurality of power amplifiers and the up-conversion module is substantially identical.

Each of the power amplifiers 84-1 through 84-3 may be of a similar construct, which includes a pair of input transistors to receive opposite phases of the differential up-converted signal 110, loads coupled in series with each of the input transistors and a current source coupled to the sources of each transistor. As one of average skill in the art will appreciate, the power amplifiers may be constructed in a variety of ways to achieve the desired power amplification.

Each of the power amplifiers amplifies the differential up-converted signal, or a signal, 110 to produce a plurality of differential amplified RF signals 114. Each of the differential amplified RF signals 114 is provided to a corresponding balun 102-106. The baluns 102-106, which may be transformer baluns or inductor/capacitor baluns, convert the differential amplified RF signals 114 into a plurality of single ended signals 116.

The combining module 120 receives the plurality of single ended signals 116 and combines them to produce a single ended RF signal 118. The combining module 120 may be a power combiner, which is commercially available, or a combination of passive components such as inductors and/or capacitors. As one of average skill in the art will appreciate, the combining module 120 may be an on-chip device or an off-chip device. When the combining module 120 is on-chip, the coupling between the baluns and the combining module 120 should be balanced. Such balanced IC coupling provides similar impedances and frequency responses between the baluns and combining module. If the combining module 120 is off-chip, the balanced integrated circuit coupling is between the baluns 102-106 and the corresponding pins of the integrated circuit that includes transmitter 100.

The transmitter 100 may further include the transmitter filtering module 85 as illustrated in FIG. 2. Such a filtering module 85 may be coupled to the output of the combining module 120. Alternatively, the transmitter filtering module 85 may include a plurality of differential filters coupled to the outputs of the power amplifiers. As a further alternative, the transmitter filtering module 85 may include a plurality of single-ended filters coupled to the outputs of the baluns 102-106.

Figure 4:
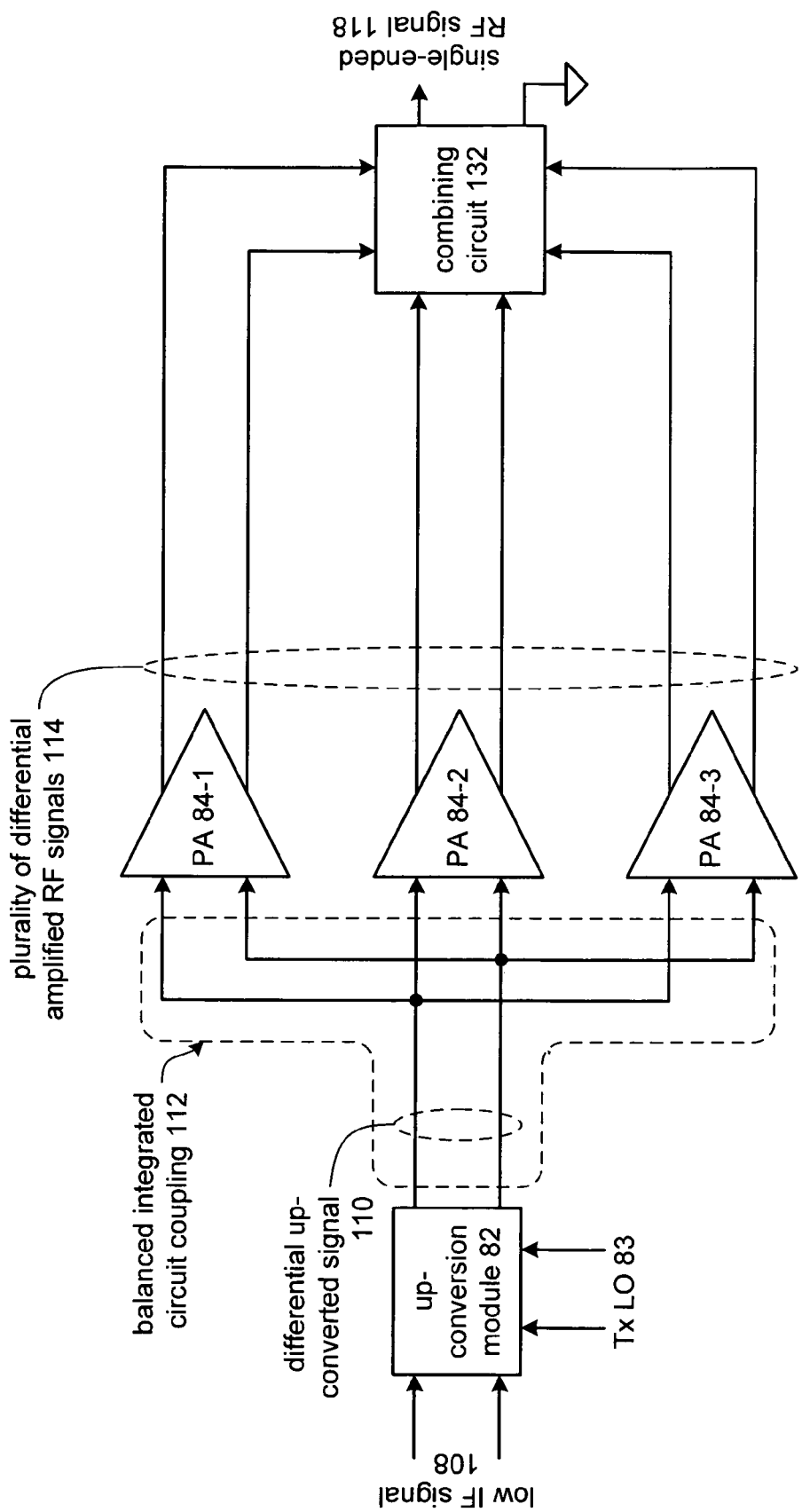
FIG. 4 is a schematic block diagram of an alternate embodiment of a linear highs powered integrated circuit transmitter in accordance with the present invention.

FIG. 4 is a schematic block diagram of another embodiment of a linear high powered integrated circuit transmitter 130 which may be used in the wireless communication device illustrated in FIG. 2. The transmitter 130 includes the up-conversion module 82, the plurality of power amplifiers 84-1 through 84-3, and a combining circuit 132. The functionality, and construct, of the up-conversion module 82, the balanced integrated circuit coupling 112 and the power amplifiers 84-1 through 84-3 is as previously discussed with reference to FIG. 3. The transmitter 130 may be implemented as an integrated circuit and may be fabricated in accordance with CMOS technology, or any other type of integrated circuit technology.

The combining circuit 132 receives the plurality of differential amplified signals 114 from the power amplifiers 84-1 through 84-3. Upon receiving these signals, the combining circuit 132 combines them to produce a single ended RF signal 118. In one embodiment of the combining circuit 132, it includes a plurality of baluns operably coupled to the plurality of power amplifiers and a combiner that combines the single ended signals produced by the baluns.

The coupling between the power amplifiers and the combining circuit 132 is balanced such that the impedances and frequency/gain responses of the coupling are balanced between each of the power amplifiers in the combining circuit 132.

The transmitter 130 may further include the transmit filter 85 as shown in FIG. 2 coupled after the combining circuit 132. Alternatively, the transmit filter may include a plurality of filters coupled to the outputs of the power amplifiers 84-1 through 84-3.

Figure 5:
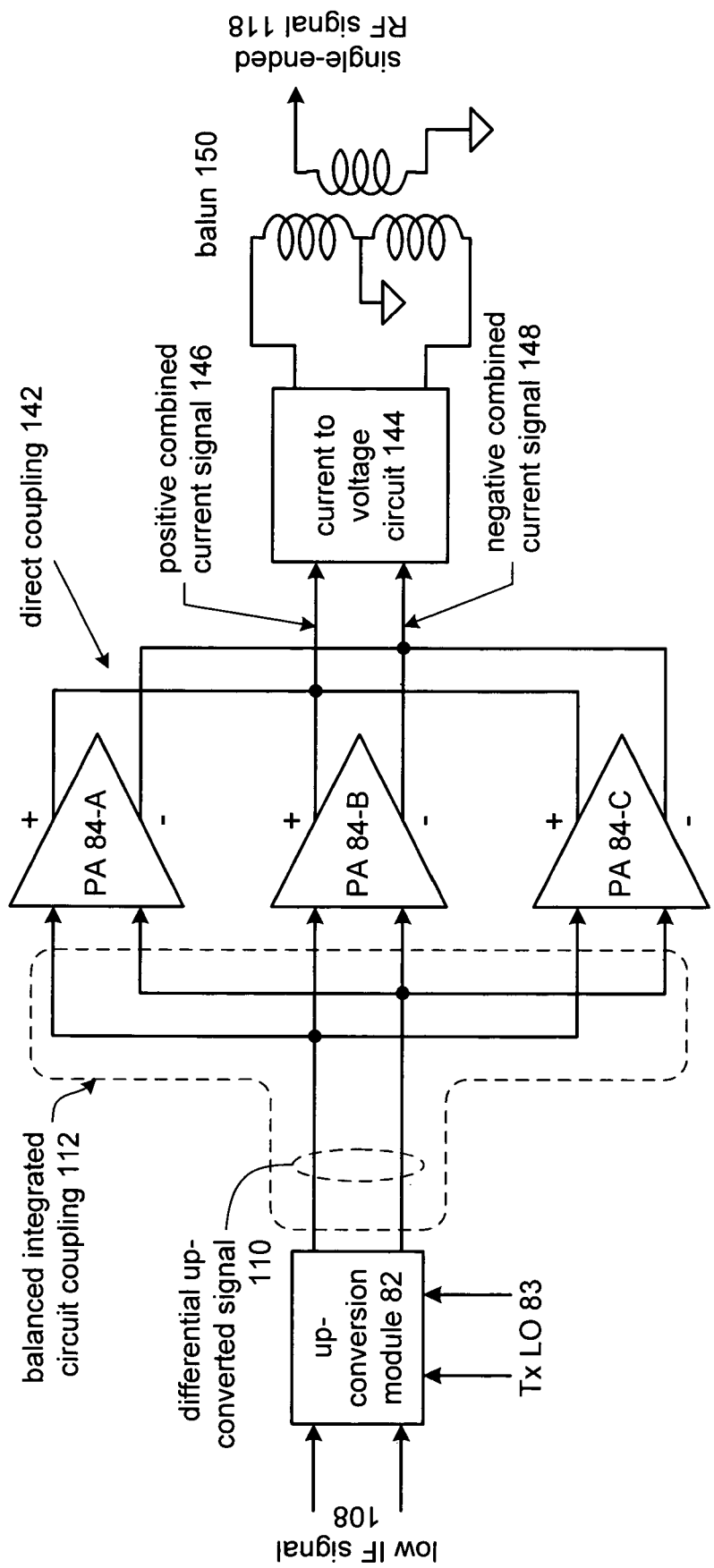
FIG. 5 is a schematic block diagram of yet another embodiment of a linear high powered integrated circuit transmitter in accordance with the present invention.

FIG. 5 is a schematic block diagram of another embodiment of a linear high powered integrated transmitter 140 that may be used in the wireless communication device illustrated in FIG. 2. The transmitter 140 includes the up-conversion module 82, the balanced integrated circuit coupling 112, a plurality of current mode power amplifiers 84-A through 84-C, a current-to-voltage circuit 144, an a balun 150. The transmitter 140 may be implemented as an integrated circuit and may be fabricated in accordance with CMOS technology, or any other type of integrated circuit technology.

In this embodiment, the up-conversion module 82 produces the differential up-converted signal 110 by mixing the low IF signal 108 with the transmitter local oscillation 83. The power amplifiers 84-A through 84-C amplify the differential up-converted signal 110 and produces amplified current signals, which are differential. The positive phases of each of the power amplifiers 84-A through 84-C are directly coupled together via direct coupling 142 to produce a positive combined current signal 146. Similarly, the negative phases of the power amplifier output 84-A through 84-C are directly combined via direct coupling 142 to produce a negative combined current signal 148. Accordingly, the power amplifiers 84-A through 84-C are transconductance power amplifiers.

The current-to-voltage circuit 144 converts the positive and negative combined current signals 146 and 148 into a differential voltage signal. The current-to-voltage circuit 144 may include resistors, inductors, capacitors and/or transistors to perform the current-to-voltage transformation. The balun 150, which may be a transformer or inductor/capacitor circuit, receives the differential voltage and converts it into a single ended RF signal 118. The transmit filter 85 as shown in FIG. 2 may be included before or after the balun 150.

The preceding discussion has presented various embodiments of a linear high powered integrated circuit transmitter that may be implemented using CMOS technology to achieve linear output power ranges greater than 7 dB. While the embodiments of FIGS. 3-5 have shown three power amplifiers, more or less amplifiers may be used to achieve more or less output power than the approximately 13 dBm provided by three power amplifiers. As one of average skill in the art will appreciate, other embodiments may be derived from the teaching of the present invention, without deviating from the scope of the claims.

What is claimed is:

1. A linear high-powered integrated circuit amplifier comprises:
    a plurality of power amplifiers on an integrated circuit;
    balanced integrated circuit coupling that provides a signal to the plurality of power amplifiers, the balanced integrated circuit coupling exhibiting frequency response characteristics and impedances, wherein the plurality of power amplifiers amplify the signal to produce a plurality of amplified signals; and
    combining circuit operably coupled to combine the plurality of amplified signals to produce a high-powered amplified signal.

2. The linear high-powered integrated circuit amplifier of claim 1, wherein the combining circuit further comprises:
    a plurality of baluns operably coupled to the plurality of power amplifiers, wherein the plurality of baluns converts differential signals into a single-ended signals, wherein the plurality of power amplifiers provides the plurality of amplified signals as the differential signals; and
    a combiner operably coupled to combine the single-ended signals into the high-powered amplified signal.

3. The linear high-powered integrated circuit amplifier of claim 2, wherein each of the plurality of baluns further comprises at least one of:
    a transformer balun; and
    an inductor-capacitor circuit balun.

4. The linear high-powered integrated circuit amplifier of claim 2 further comprises:
    second balanced integrated circuit coupling that couples the plurality of power amplifiers to the plurality of baluns; and
    third balanced integrated circuit coupling that couples the plurality of baluns to the combiner.

5. The linear high-powered integrated circuit amplifier of claim 1 further comprises:
    the plurality of power amplifiers provides the plurality of amplified signals as differential current signals to the combining circuit; and
    the combining circuit includes directly coupling, a current to voltage circuit, and a balun, wherein the direct coupling couples positive outputs of the plurality of power amplifiers together to produce a positive combined current signal and couples negative outputs of the plurality of power amplifiers to produce a negative combined current signal, wherein the current to voltage circuit converts the first and second combined current signals into a differential voltage signal, and wherein the balun converts the differential voltage signal into the high-powered amplified signal.

6. The linear high-powered integrated circuit amplifier of claim 1 further comprises being fabricated using CMOS technology.

7. A linear high-powered integrated circuit amplifier comprises:
    a plurality of power amplifiers;
    balanced integrated circuit coupling operable to couple a signal to the plurality of power amplifiers, wherein the plurality of power amplifiers amplify the signal to produce a plurality of differential amplified signals; and
    plurality of baluns operably coupled to the plurality of power amplifiers, wherein the plurality of baluns converts the plurality of differential amplified signals into a single-ended signals, and wherein the plurality of baluns provides the single-ended signals off chip for off-chip combining.

8. The linear high-powered integrated circuit amplifier of claim 7, wherein each of the plurality of baluns further comprises at least one of:
    a transformer balun; and
    an inductor-capacitor circuit balun.

9. The linear high-powered integrated circuit amplifier of claim 7 further comprises:
    second balanced integrated circuit coupling that couples the plurality of power amplifiers to the plurality of baluns; and
    third balanced integrated circuit coupling that couples the plurality of baluns to pads for off-chip coupling to a combiner.

10. The linear high-powered integrated circuit transmitter of claim 7 further comprises being fabricated using CMOS technology.

11. A linear high-powered integrated circuit amplifier comprises:
    a plurality of power amplifiers;
    balanced integrated circuit coupling that couples a signal to the plurality of power amplifiers, wherein the plurality of power amplifiers amplify the signal to produce differential current signals;

direct coupling that couples positive outputs of the plurality of power amplifiers together to produce a positive combined current signal and couples negative outputs of the plurality of power amplifiers to produce a negative combined current signal, current to voltage circuit operably coupled to convert the positive and negative combined current signals into a differential voltage signal, and a balun operably coupled to convert the differential voltage signal into a single-ended high-powered amplified signal.

12. The linear high-powered integrated circuit amplifier of claim 11, wherein the balun further comprises at least one of:

a transformer balun; and an inductor-capacitor circuit balun.

13. The linear high-powered integrated circuit amplifier of claim 11 further comprises:

second balanced integrated circuit coupling that couples the plurality of power amplifiers to the current to voltage circuit; and third balanced integrated circuit coupling that couples the current to voltage circuit to the balun.

14. The linear high-powered integrated circuit amplifier of claim 11 further comprises being fabricated using CMOS technology.

* * * * *